(12) United States Patent
Lien et al.

(10) Patent No.: US 11,791,786 B2
(45) Date of Patent: Oct. 17, 2023

(54) CIRCUIT AND METHOD TO ENHANCE EFFICIENCY OF SEMICONDUCTOR DEVICE

(71) Applicant: TAIWAN SEMICONDUCTOR MANUFACTURING COMPANY LTD., Hsinchu (TW)

(72) Inventors: Bei-Shing Lien, Taipei (TW); Jaw-Juinn Horng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 273 days.

(21) Appl. No.: 17/146,426

(22) Filed: Jan. 11, 2021

(65) Prior Publication Data

US 2022/0224297 A1 Jul. 14, 2022

(51) Int. Cl.
*H03F 3/45* (2006.01)

(52) U.S. Cl.
CPC ... *H03F 3/45475* (2013.01); *H03F 2200/129* (2013.01); *H03F 2203/45512* (2013.01)

(58) Field of Classification Search
CPC .......................................................... H03F 3/45
USPC ....................................... 330/9, 69, 252, 260
See application file for complete search history.

(56) References Cited

U.S. PATENT DOCUMENTS 6,768,374 B1 * 7/2004 Lee .................... H03G 1/0094
330/109
7,639,074 B2 * 12/2009 Chen .................... H03F 3/005
330/86

OTHER PUBLICATIONS

Tae-Hwan Oh and Seung-Hoon Lee, "Single-Chip CMOS CCD Camera Interface Based on Digitally Controlled Capacitor-Segment Combination," IEEE Transaction on Circuits and Systems-II: Analog and Digital Signal Processing, vol. 47, No. 11, 1338-1343, (2000).
Seung-Bin You, Jae-Whui Kim, Suki Kim, "A CMOS 16-bit 20MSPS Analog Front End for Scanner/MFP Applications," IEEE, 647-652, (2003).
Ion Opris, Jonathan Kleks, Yasunori Noguchi, James Castillo, Shiyin Siou, Murty Bhavana, Youichi Nakasone, Shingo Kokudo, Seiichiro Watanabe, "A 12-bit 50Mpixel/s Analog Front End Processor for Digital Imaging Systems," NuCORE Technology Inc. 1-26 (2000).
You-Jin Cha, Jin-Kug Lee, Jin Park, Seung-Hoon Lee, "Digitally-Controlled Automatic Gain control Circuits for CMOS CCD Electronic Cameras," IEEE VL3-05, 342-345 (1999).

* cited by examiner

*Primary Examiner* — Henry Choe
(74) *Attorney, Agent, or Firm* — WPAT LAW; Anthony King

(57) ABSTRACT

A circuit includes an operational amplifier, a plurality of input capacitors, a plurality of output capacitors, a plurality of sampling switches, a plurality of holding switches, a plurality of combined switches. The input capacitors include a first input capacitor and a second input capacitor. The output capacitors include a first output capacitor and a second output capacitor. The sampling switches include a first sampling switch, a second sampling switch, a third sampling switch and a fourth sampling switch. The holding switches include a first holding switch and a second holding switch. The combined switches include a first combined switch and a second combined switch.

20 Claims, 17 Drawing Sheets

CIRCUIT AND METHOD TO ENHANCE EFFICIENCY OF SEMICONDUCTOR DEVICE

BACKGROUND

Semiconductor devices are used in integrated circuits for electronic applications, including cell phones and personal computing devices. A well-known semiconductor device is amplifier for sampling and amplifying the input signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
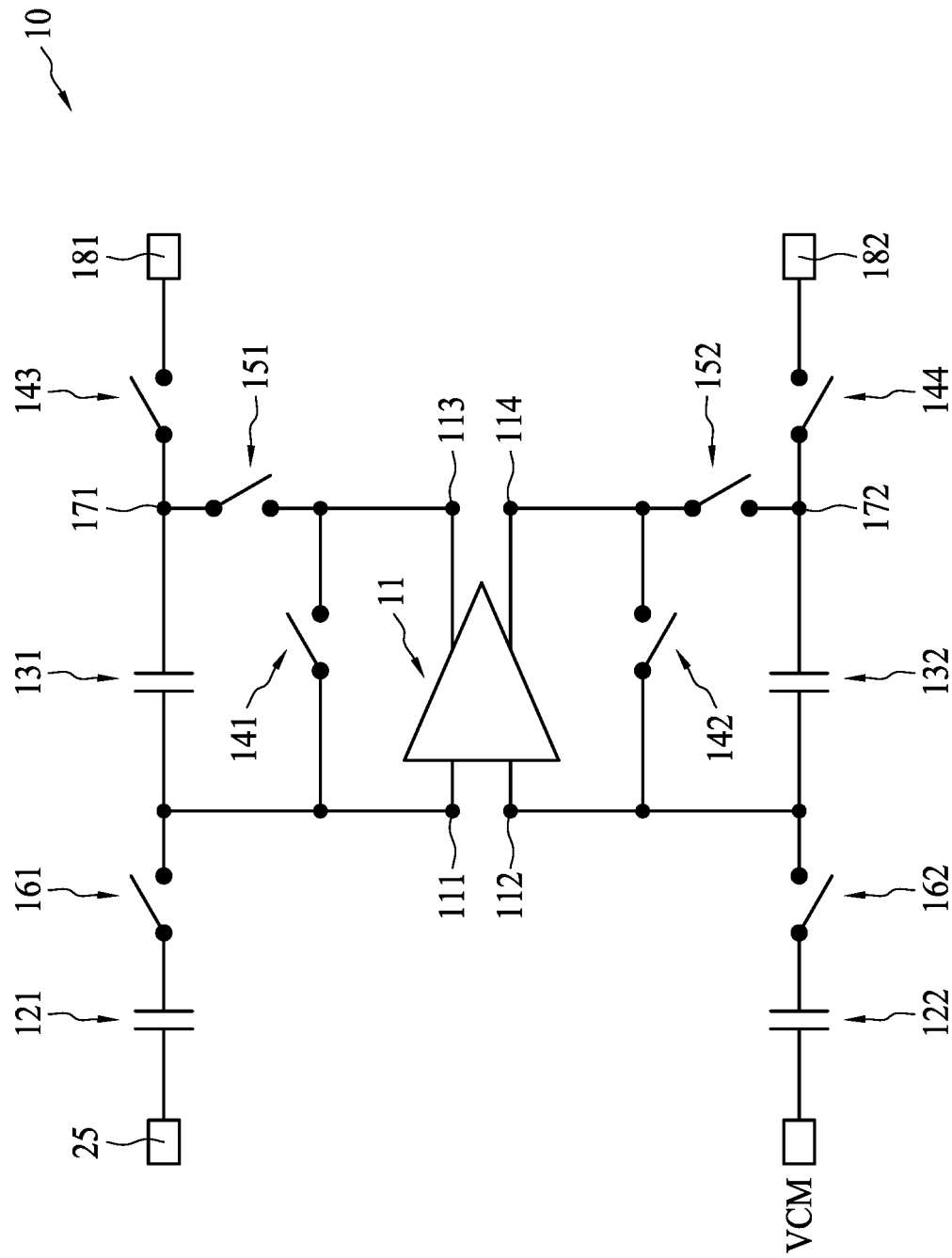
FIG. 1 illustrates a circuit in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to the figures, wherein like numerals indicate like parts throughout the several views. FIG. 1 illustrates a circuit in accordance with some embodiments of the present disclosure. Referring to FIG. 1, a circuit 10 includes an operational amplifier 11, a plurality of input capacitors 121, 122, a plurality of output capacitors 131, 132, a plurality of sampling switches 141, 142, 143, 144, a plurality of holding switches 151, 152, and a plurality of combined switches 161, 162. The circuit 10 may be applied in Built-in-Self-Test automatic device VTGM test system for on die parameter monitoring IP, and may be applied in CCD/CMOS image sensor and scanner analog front end for low noise signal sampling. The circuit 10 may be a correlated double sampler without interleaving. The circuit 10 may perform operational amplifier offset calibration. The circuit 10 may sample signal and amplify signal in one clock cycle, and no need for specific clock signal. The circuit 10 may be a non-interleaving architecture saving input sampling capacitance which is around 4-8 pF for low noise CCD signal amplification.

In accordance with some embodiments of the present disclosure, the operational amplifier 11 having a first input terminal 111, a second input terminal 112, a first output terminal 113 and a second output terminal 114. The operational amplifier 11 may be an operational transconductance amplifier (OTA).

In accordance with some embodiments of the present disclosure, the input capacitors include a first input capacitor 121 and a second input capacitor 122. One end of the first input capacitor 121 is configured for receiving an input signal 25, one end of the second input capacitor 122 is configured for receiving a common signal, for example a common voltage VCM. In accordance with some embodiments of the present disclosure, the first input capacitor 121 is the same as the second input capacitor 122, and the capacitance of the first input capacitor 121 is C1.

In accordance with some embodiments of the present disclosure, the output capacitors include a first output capacitor 131 and a second output capacitor 132. The first output capacitor 131 is coupled to the first input terminal 111 and a first node 171. The second output capacitor 132 is coupled to the second input terminal 112 and a second node 172. In accordance with some embodiments of the present disclosure, the first output capacitor 131 is the same as the second output capacitor 132, and the capacitance of the first output capacitor 131 is C2.

In accordance with some embodiments of the present disclosure, the sampling switches include a first sampling switch 141, a second sampling switch 142, a third sampling switch 143 and a fourth sampling switch 144. The first sampling switch 141 is coupled to the first input terminal 111 and the first output terminal 113 of the operational amplifier 11. The second sampling switch 142 is coupled to the second input terminal 112 and the second output terminal 114 of the operational amplifier 11. The third sampling switch 143 is coupled to the first node 171 and a first output end 181. The fourth sampling switch 144 is coupled to the second node 172 and a second output end 182.

In accordance with some embodiments of the present disclosure, the holding switches include a first holding switch 151 and a second holding switch 152. The first holding switch 151 is coupled to the first node 171 and the first output terminal 113 of the operational amplifier 11. The second holding switch 152 is coupled to the second node 172 and the second output terminal 114 of the operational amplifier 11.

In accordance with some embodiments of the present disclosure, the combined switches include a first combined switch 161 and a second combined switch 162. The first combined switch 161 is coupled to the other end of the first input capacitor 121 and the first input terminal 111 of the operational amplifier 11. The second combined switch 162 is coupled to the other end of the second input capacitor 122 and the second input terminal 112 of the operational amplifier 11.

Figure 2:
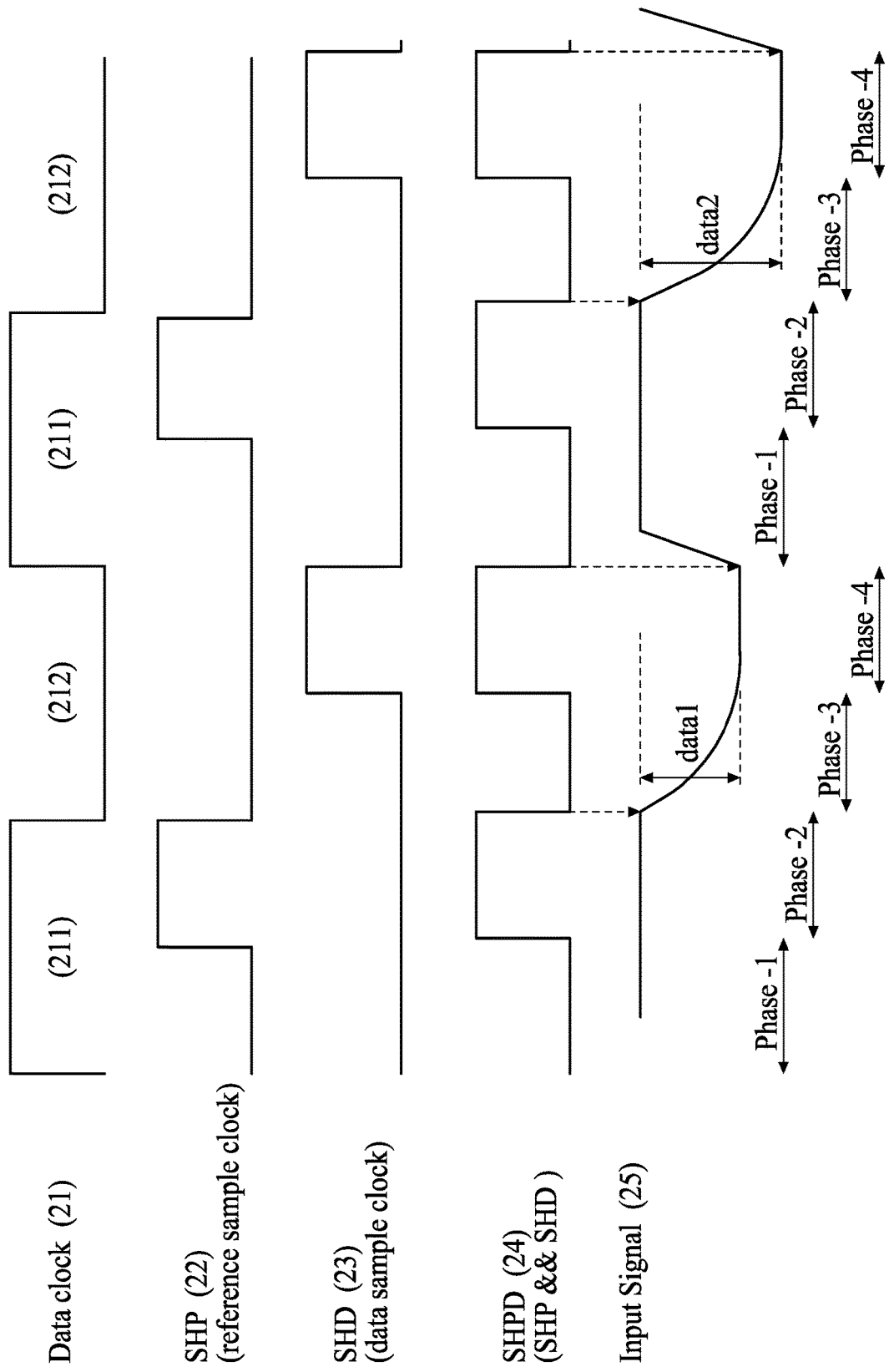
FIG. 2 is a waveform diagram of data clock signal, combined clock signal and input signal in accordance with some embodiments of the present disclosure.

FIG. 2 is a waveform diagram of data clock signal, combined clock signal and input signal in accordance with some embodiments of the present disclosure. Referring to FIG. 1 and FIG. 2, the sampling switches 141, 142, 143, 144 are controlled by a sampling cycle 211 of a data clock 21. That is, when the sampling cycle 211 of the data clock 21 is at a high level, the sampling switches 141, 142, 143, 144 are closed. The holding switches 151, 152 are controlled by a holding cycle 212 of the data clock 21. That is, when the holding cycle 212 of the data clock 21 is at a low level, the holding switches 151, 152 are closed. Further, the data clock 21 includes the sampling cycle 211 and the holding cycle 212.

In accordance with some embodiments of the present disclosure, the combined switches 161, 162 are controlled by a combined clock 24 combined from a reference sample clock 22, for example a SHP clock, and a data sample clock 23, for example a SHD clock. The reference sample clock 22 includes a reference sample cycle 221 at a high level, and the data sample clock 23 includes a data sample clock 231 at a high level, and the combined clock 24 includes a combined cycle 241 having the reference sample cycle 221 and the data sample clock 231. That is, the combined cycle 241 is at a high level when the reference sample cycle 221 is at a high level and the data sample cycle 231 is at a high level. Furthermore, when the combined cycle 241 of the combined clock 24 is at a high level, the combined switches 161, 162 are closed.

In accordance with some embodiments of the present disclosure, the input signal 25 inputs a VINP1 level and a VIND1 level during the data 1 sampling and holding period. Thus, the data 1 is equal to (VINP1-VIND1). The data 1 sampling and holding period include a first phase 26, a second phase 27, a third phase 28, a fourth phase 29. During the first phase 26, the sampling cycle 211 of the data clock 21 is at a high level, and the combined clock 24 is at a low level. During the second phase 27, the sampling cycle 211 of the data clock 21 is at a high level, and the combined cycle 241 of the combined clock 24 is at a high level. During the third phase 28, the holding cycle 212 of the data clock 21 is at a low level, and the combined clock 24 is at a low level. During the fourth phase 29, the holding cycle 222 of the data clock 21 is at a low level, and the combined cycle 241 of the combined clock 24 is at a high level.

Figure 3A:
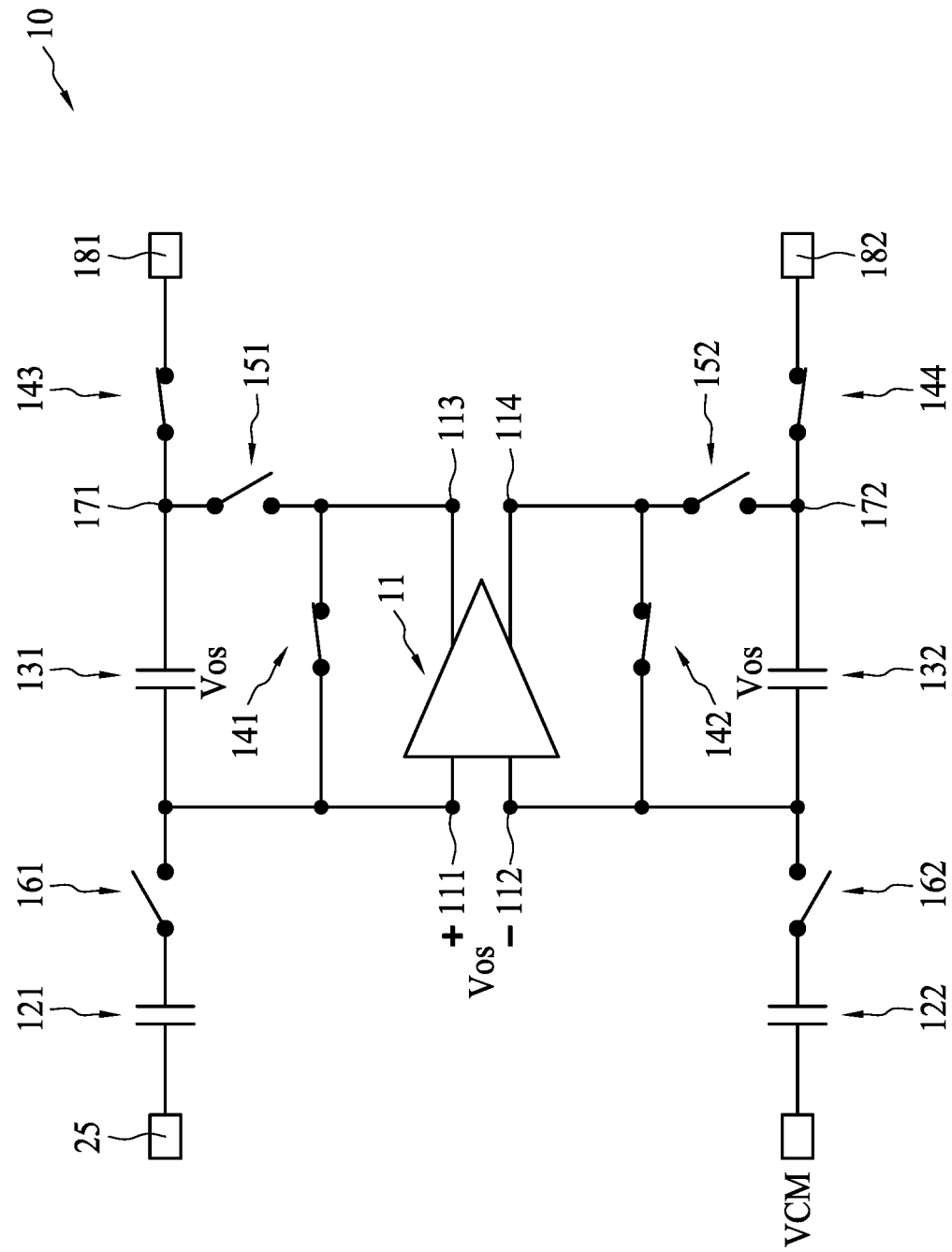
FIG. 3A illustrates a circuit during a first phase of the circuit in FIG. 1 in accordance with some embodiments of the present disclosure.

FIG. 3A illustrates a circuit during a first phase of the circuit in FIG. 1 in accordance with some embodiments of the present disclosure. Referring to FIG. 1, FIG. 2 and FIG. 3A, as stated in the above, during the first phase 26, the sampling cycle 211 of the data clock 21 is at a high level, and the combined clock 24 is at a low level. Thus, during the first phase 26, the sampling switches 141, 142, 143, 144 are closed, the holding switches 151, 152 are open, and the combined switches 161, 162 are open as shown in FIG. 3A. Since the combined switches 161, 162 are open, the input signal 25 isn't connected to the operational amplifier 11. Therefore, during the first phase 26, the operational amplifier 11 proceeds input/output offset storage, and an offset $V_{os}$ between the first input terminal 111 and the second input terminal 112 of the operational amplifier 11 is saved in the first output capacitor 131 and the second output capacitor 132.

Figure 3B:
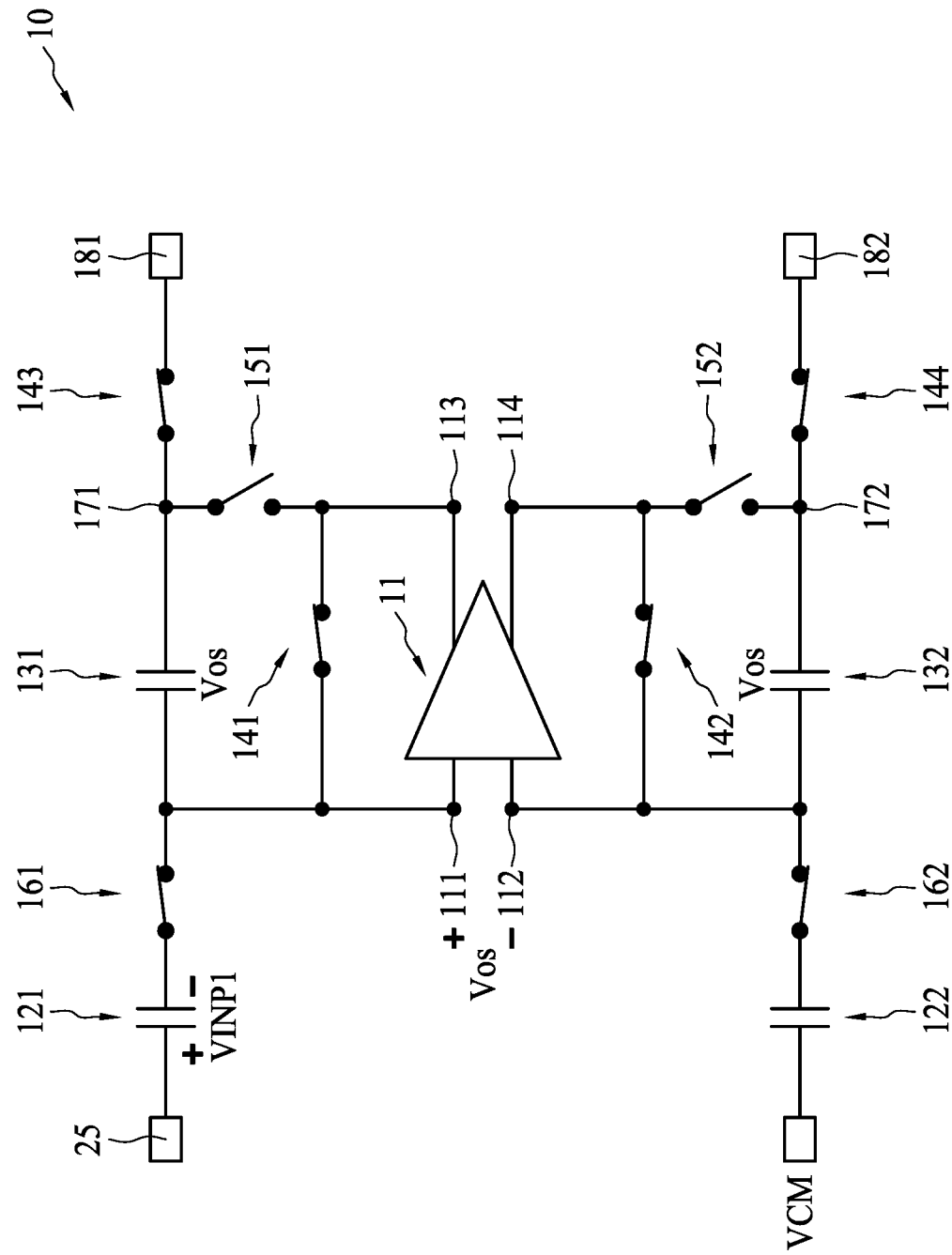
FIG. 3B illustrates a circuit during a second phase of the circuit in FIG. 1 in accordance with some embodiments of the present disclosure.

FIG. 3B illustrates a circuit during a second phase of the circuit in FIG. 1 in accordance with some embodiments of the present disclosure. Referring to FIG. 1, FIG. 2 and FIG. 3B, as stated in the above, during the second phase 27, the sampling cycle 211 of the data clock 21 is at a high level, and the combined cycle 241 of the combined clock 24 is at a high level. Thus, during the second phase 27, the sampling switches 141, 142, 143, 144 are closed, the holding switches 151, 152 are open, and the combined switches 161, 162 are closed as shown in FIG. 3B. Since the combined switches 161, 162 are closed, the input signal 25 is coupled to the first input capacitor 121 and the operational amplifier 11. Therefore, during the second phase 27, the VINP1 level of the input signal 25 is saved in the first input capacitor 121.

Figure 3C:
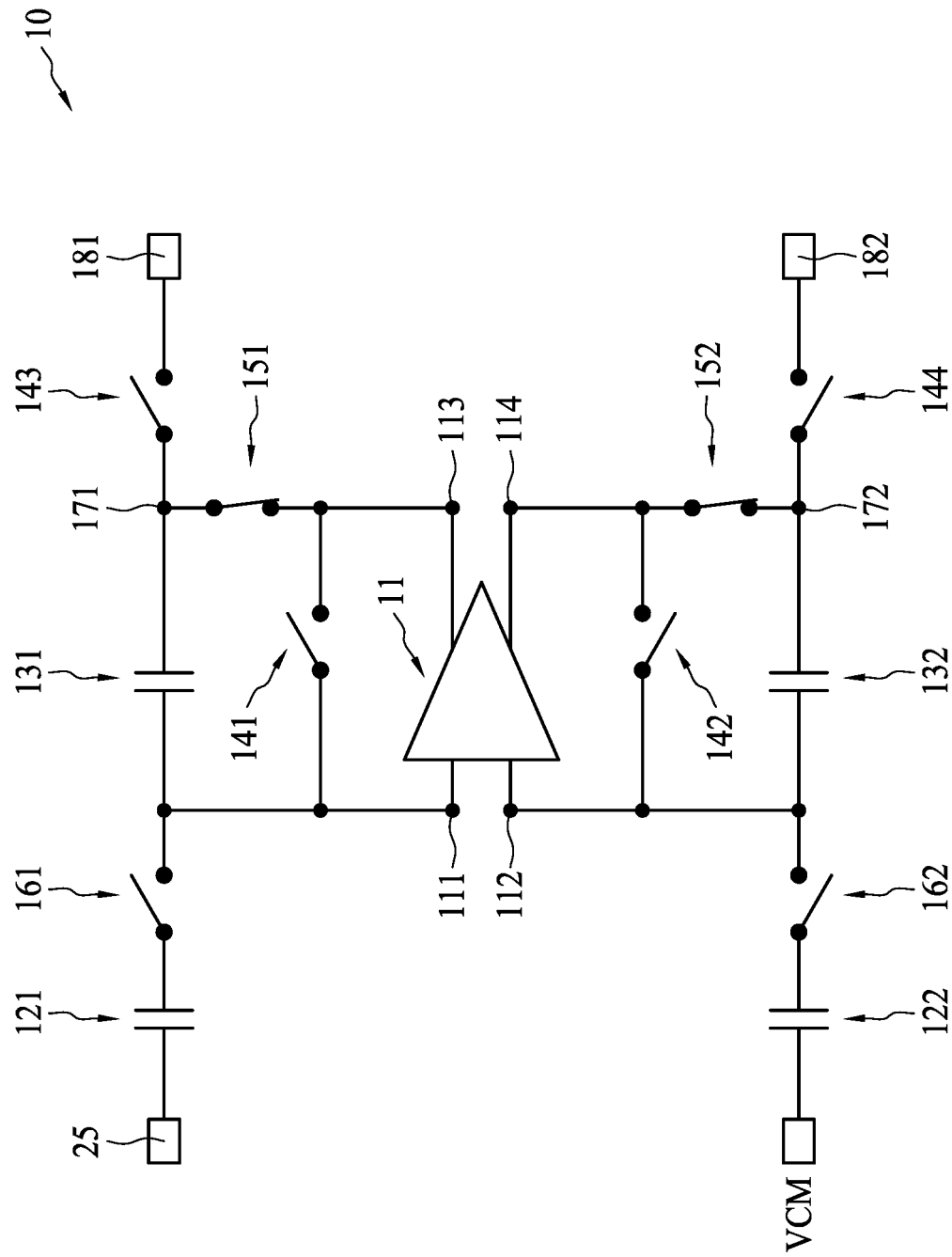
FIG. 3C illustrates a circuit during a third phase of the circuit in FIG. 1 in accordance with some embodiments of the present disclosure.

FIG. 3C illustrates a circuit during a third phase of the circuit in FIG. 1 in accordance with some embodiments of the present disclosure. Referring to FIG. 1, FIG. 2 and FIG. 3C, as stated in the above, during the third phase 28, the holding cycle 212 of the data clock 21 is at a low level, and the combined clock 24 is at a low level. Thus, during the third phase 28, the sampling switches 141, 142, 143, 144 are open, the holding switches 151, 152 are closed, and the combined switches 161, 162 are open as shown in FIG. 3C. Since the combined switches 161, 162 are open, the first input capacitor 121 holds the VINP1 level of the input signal 25 in the second phase 27. Further, during the third phase 28, the operational amplifier 11 executes offset calibration, and the offset $V_{os}$ stored in the first output capacitor 131 and the second output capacitor 132 in the first phase 26 and the second phase 27 is removed.

Figure 3D:
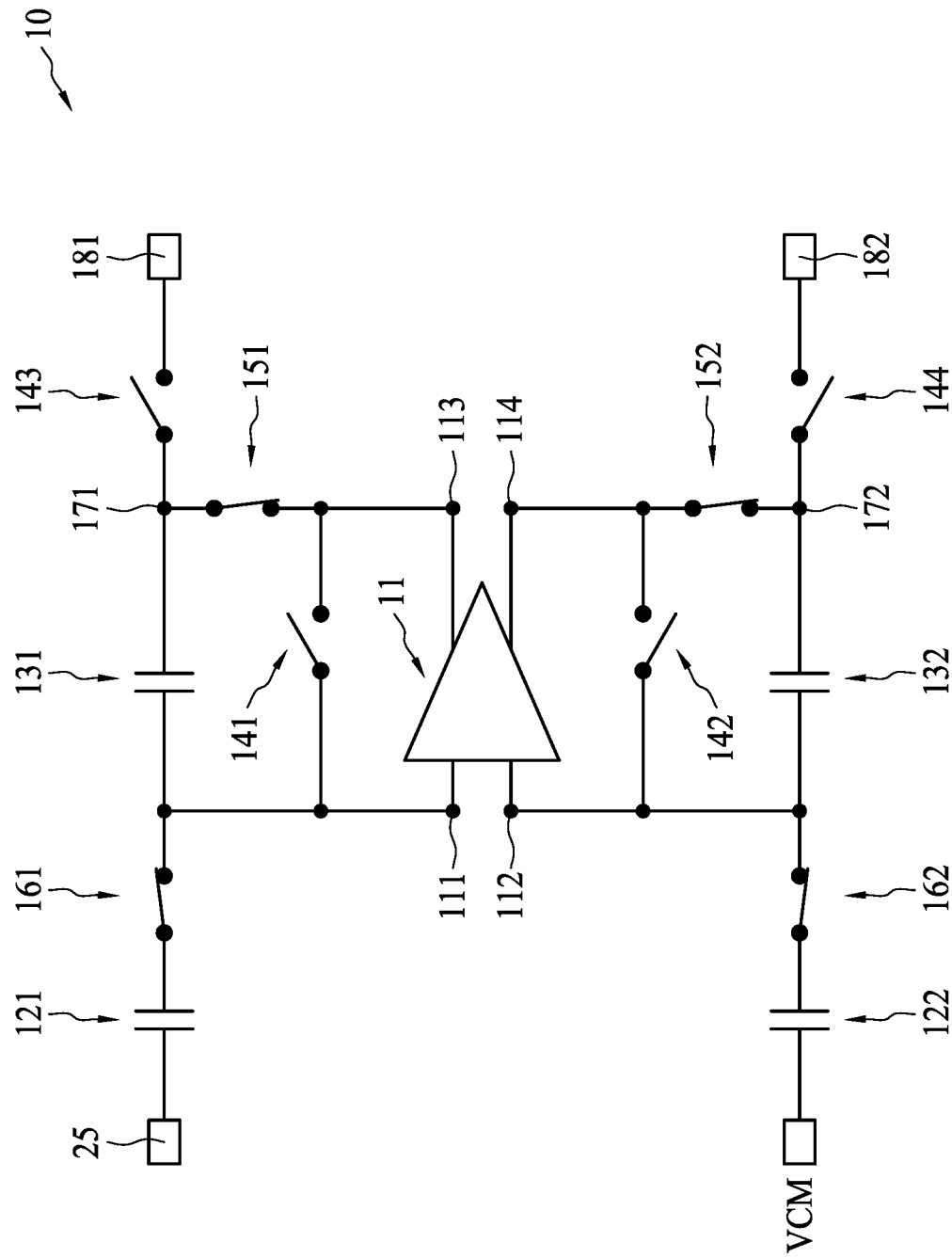
FIG. 3D illustrates a circuit during a fourth phase of the circuit in FIG. 1 in accordance with some embodiments of the present disclosure.

FIG. 3D illustrates a circuit during a fourth phase of the circuit in FIG. 1 in accordance with some embodiments of the present disclosure. Referring to FIG. 1, FIG. 2 and FIG. 3D, as stated in the above, during the fourth phase 29, the holding cycle 212 of the data clock 21 is at a low level, and the combined cycle 241 of the combined clock 24 is at a high level. Thus, during the fourth phase 29, the sampling switches 141, 142, 143, 144 are open, the holding switches 151, 152 are closed, and the combined switches 161, 162 are closed as shown in FIG. 3D. Since the combined switches 161, 162 are closed, the operational amplifier 11 samples the VIND1 level of the input signal 25 and amplifies the data 1 (VINP1-VIND1) on the first output terminal 113 and the second output terminal 114 of the operational amplifier 11. The gain of the operational amplifier 11 is −C1/C2.

In accordance with some embodiments of the present disclosure, the circuit 10 may be applied in Built-in-Self-Test automatic device VTGM test system for on die parameter monitoring IP, and may be applied in CCD/CMOS image sensor and scanner analog front end for low noise signal sampling. The circuit 10 may be a correlated double sampler without interleaving. The circuit 10 may perform operational amplifier offset calibration. The circuit 10 may sample signal and amplify signal in one clock cycle, and no need for specific clock signal. The circuit 10 may be a non-interleaving architecture saving input sampling capacitance which is around 4-8 pF for low noise CCD signal amplification.

Figure 4:
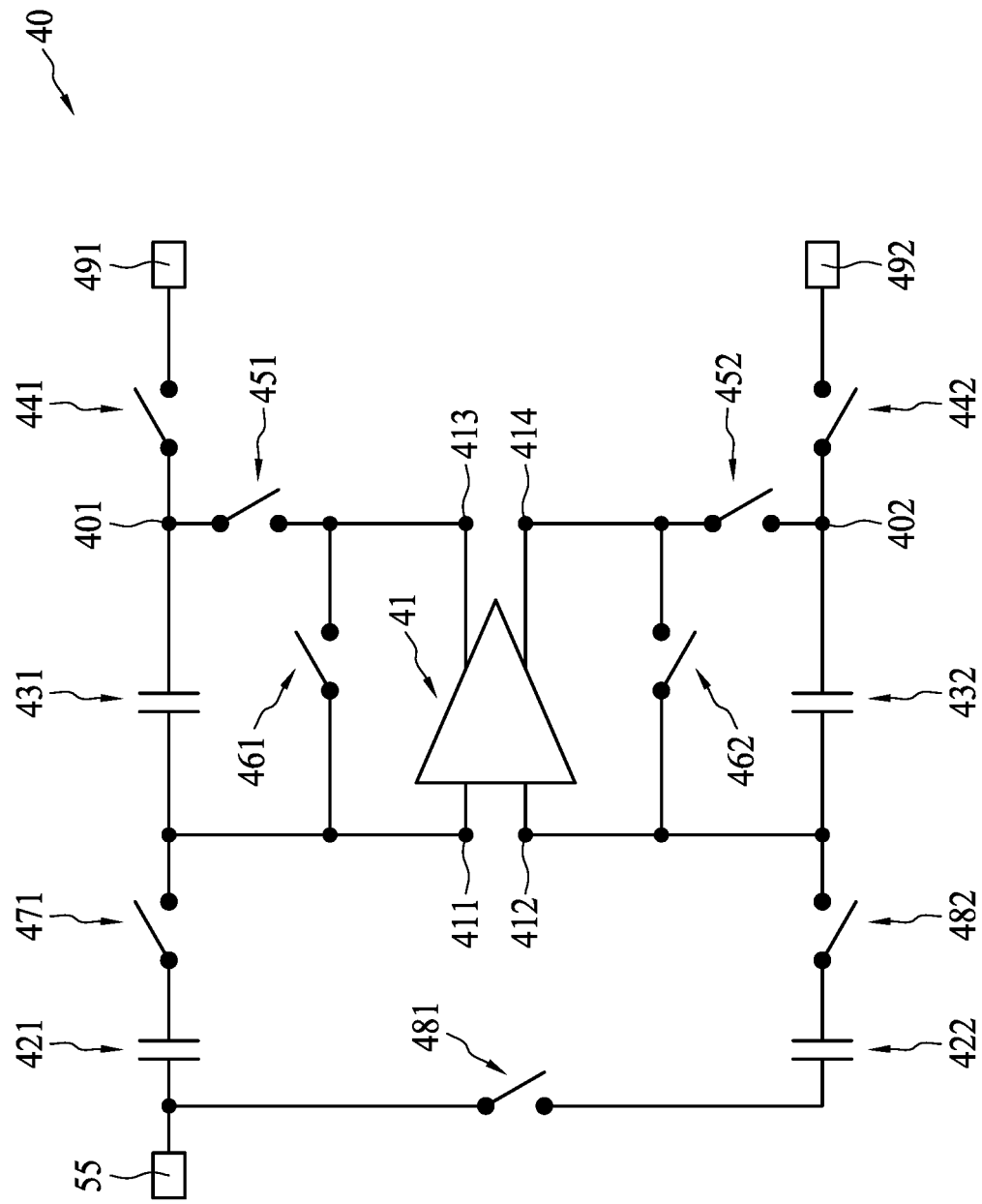
FIG. 4 illustrates a circuit in accordance with some embodiments of the present disclosure.

FIG. 4 illustrates a circuit in accordance with some embodiments of the present disclosure. Referring to FIG. 4, a circuit 40 includes an operational amplifier 41, a plurality of input capacitors 421, 422, a plurality of output capacitors 431, 432, a plurality of sampling switches 441, 442, a plurality of holding switches 451, 452, a plurality of half sampling switches 461, 462, a reference sampling switch 471 and a plurality of data sampling switches 481, 482. The circuit 40 may be applied in Built-in-Self-Test automatic device VTGM test system for on die parameter monitoring IP, and may be applied in CCD/CMOS image sensor and scanner analog front end for low noise signal sampling. The circuit 40 may be a correlated double sampler without interleaving. The circuit 40 may perform operational amplifier offset calibration. The circuit 40 may sample signal and amplify signal in one clock cycle, and no need for specific clock signal. The circuit 40 may be a non-interleaving architecture saving input sampling capacitance which is around 4-8 pF for low noise CCD signal amplification.

In accordance with some embodiments of the present disclosure, the operational amplifier 41 having a first input terminal 411, a second input terminal 412, a first output terminal 413 and a second output terminal 414. The operational amplifier 41 may be an operational transconductance amplifier (OTA).

In accordance with some embodiments of the present disclosure, the input capacitors include a first input capacitor 421 and a second input capacitor 422. One end of the first input capacitor 421 is configured for receiving an input signal 55. In accordance with some embodiments of the present disclosure, the first input capacitor 421 is the same as the second input capacitor 422, and the capacitance of the first input capacitor 421 is C1.

In accordance with some embodiments of the present disclosure, the output capacitors include a first output capacitor 431 and a second output capacitor 432. The first output capacitor 431 is coupled to the first input terminal 411 and a first node 401. The second output capacitor 432 is coupled to the second input terminal 412 and a second node 402. In accordance with some embodiments of the present disclosure, the first output capacitor 431 is the same as the second output capacitor 432, and the capacitance of the first output capacitor 431 is C2.

In accordance with some embodiments of the present disclosure, the sampling switches include a first sampling switch 441, a second sampling switch 442. The first sampling switch 441 is coupled to the first node 401 and a first output end 491. The second sampling switch 442 is coupled to the second node 402 and a second output end 492.

In accordance with some embodiments of the present disclosure, the holding switches include a first holding switch 451 and a second holding switch 452. The first holding switch 451 is coupled to the first node 401 and the first output terminal 413 of the operational amplifier 41. The second holding switch 452 is coupled to the second node 402 and the second output terminal 414 of the operational amplifier 41.

In accordance with some embodiments of the present disclosure, the half sampling switches include a first half sampling switch 461 and a second half sampling switch 462. The first half sampling switch 461 is coupled to the first input terminal 411 and the first output terminal 413 of the operational amplifier 41. The second half sampling switch 462 is coupled to the second input terminal 412 and the second output terminal 414 of the operational amplifier 41.

In accordance with some embodiments of the present disclosure, the reference sampling switch 471 is coupled to the other end of the first input capacitor 421 and the first input terminal 411 of the operational amplifier 41.

In accordance with some embodiments of the present disclosure, the data sampling switches include a first data sampling switch 481 and a second data sampling switch 482. The first data sampling switch 481 is coupled to the one end of the first input capacitor 421 and one end of the second input capacitor 422, the second data sampling switch 482 is coupled to the other end of the second input capacitor 422 and the second input terminal 412 of the operational amplifier 41.

Figure 5:
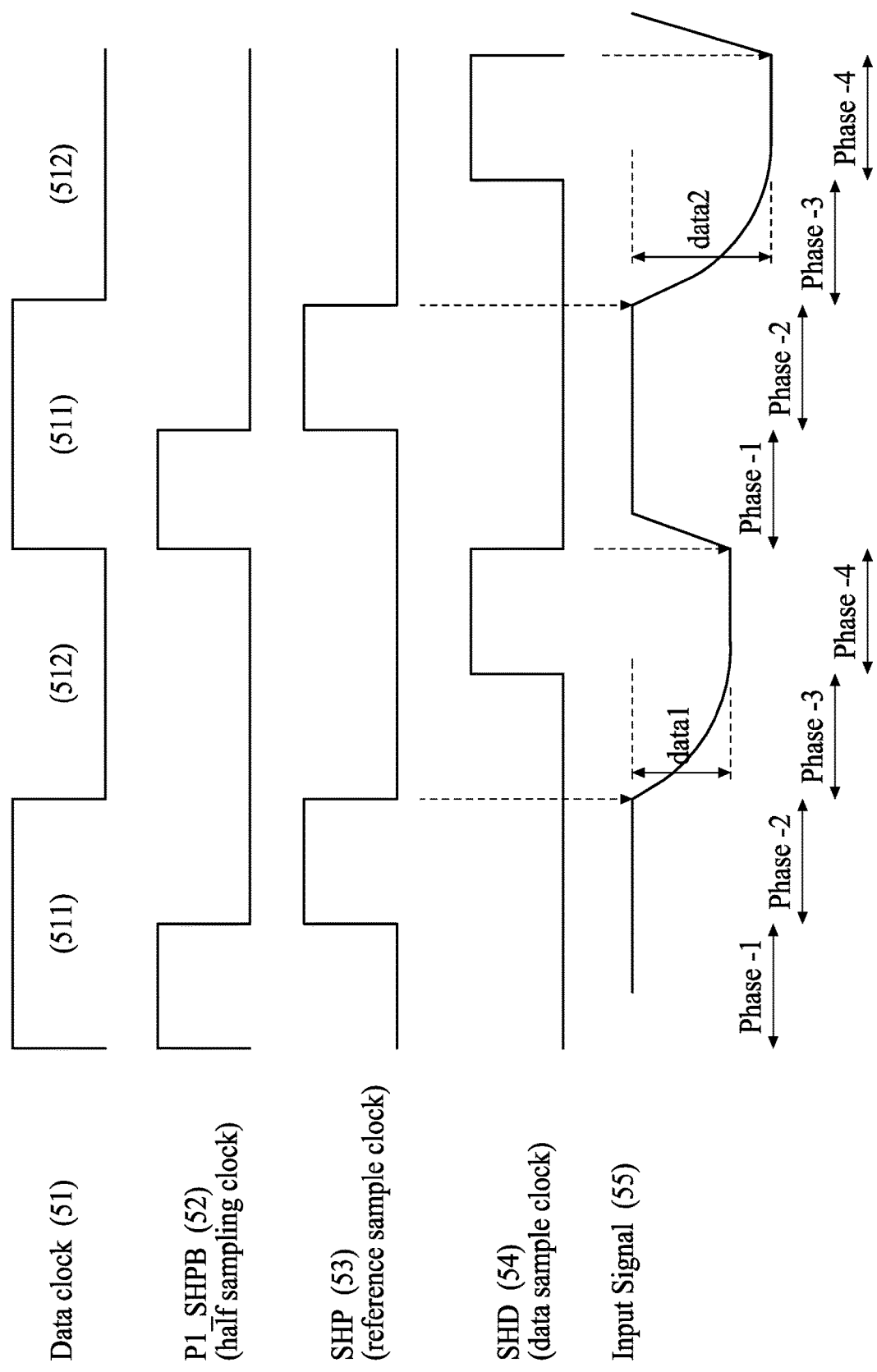
FIG. 5 is a waveform diagram of data clock signal, half sampling clock signal, reference sample clock signal, data sample clock signal and input signal in accordance with some embodiments of the present disclosure.

FIG. 5 is a waveform diagram of data clock signal, half sampling clock signal, reference sample clock signal, data sample clock signal and input signal in accordance with some embodiments of the present disclosure. Referring to FIG. 4 and FIG. 5, the sampling switches 441, 442 are controlled by a sampling cycle 511 of a data clock 51. That is, when the sampling cycle 511 of the data clock 51 is at a high level, the sampling switches 441, 442 are closed. The holding switches 451, 452 are controlled by a holding cycle 512 of the data clock 51. That is, when the holding cycle 512 of the data clock 51 is at a low level, the holding switches 451, 452 are closed. Further, the data clock 51 includes the sampling cycle 511 and the holding cycle 512.

In accordance with some embodiments of the present disclosure, the half sampling switches 461, 462 are controlled by a half sampling clock 52. That is, when the half sampling clock 52 is at a high level, the half sampling switches 461, 462 are closed. The reference sampling switch 471 is controlled by a reference sample clock 53, for example a SHP clock. That is, when the reference sample clock 53 is at a high level, the reference sampling switch 471 is closed. The data sampling switches 481, 482 are controlled by a data sample clock 54, for example a SHD clock. That is, when the data sample clock 54 is at a high level, the data sample switches 481, 482 are closed.

In accordance with some embodiments of the present disclosure, the input signal 55 inputs a VINP1 level and a VIND1 level during the data 1 sampling and holding period. Thus, the data 1 is equal to (VINP1-VIND1). The data 1 sampling and holding period include a first phase 56, a second phase 57, a third phase 58, a fourth phase 59. During the first phase 56, the sampling cycle 511 of the data clock 51 is at a high level, the half sampling clock 52 is at a high level, the reference sample clock 53 is at a low level, and the data sample clock 54 is at a low level. During the second phase 57, the sampling cycle 511 of the data clock 51 is at a high level, the half sampling clock 52 is at a low level, the reference sample clock 53 is at a high level, and the data sample clock 54 is at a low level. During the third phase 58, the holding cycle 512 of the data clock 51 is at a low level, the half sampling clock 52 is at a low level, the reference sample clock 53 is at a low level, and the data sample clock 54 is at a low level. During the fourth phase 59, the holding cycle 522 of the data clock 51 is at a low level, the half sampling clock 52 is at a low level, the reference sample clock 53 is at a low level, and the data sample clock 54 is at a high level.

Figure 6A:
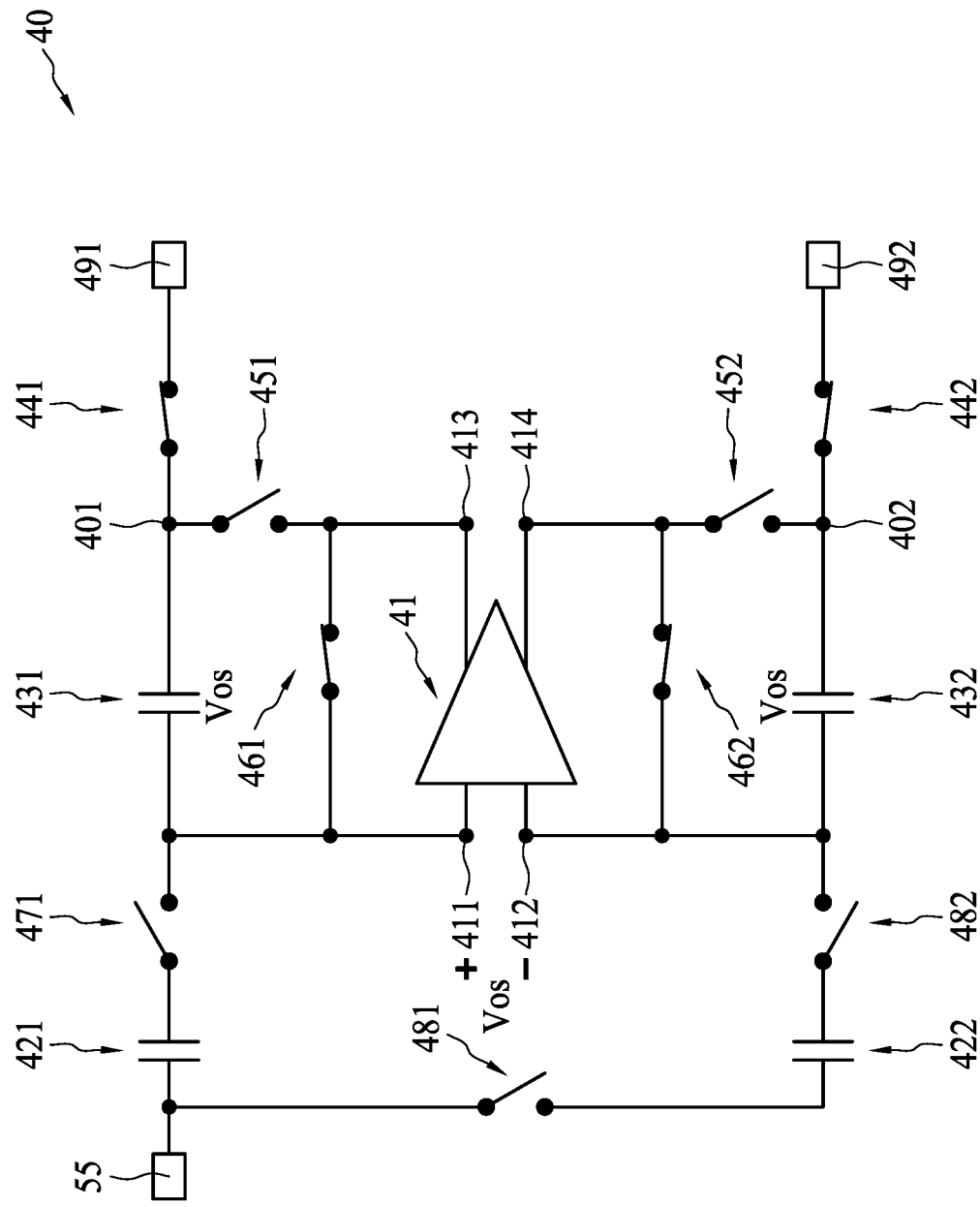
FIG. 6A illustrates a circuit during a first phase of the circuit in FIG. 4 in accordance with some embodiments of the present disclosure.

FIG. 6A illustrates a circuit during a first phase of the circuit in FIG. 4 in accordance with some embodiments of the present disclosure. Referring to FIG. 4, FIG. 5 and FIG. 6A, as stated in the above, during the first phase 56, the sampling cycle 511 of the data clock 51 is at a high level, half sampling clock 52 is at a high level, the reference sample clock 53 is at a low level, and the data sample clock 54 is at a low level. Thus, during the first phase 56, the sampling switches 441, 442 are closed, the half sampling switches 461, 462 are closed, the holding switches 451, 452 are open, the reference sampling switch 471 is open, and the data sampling switches 481, 482 are open as shown in FIG. 6A. Since the reference sampling switch 471 and the data sampling switches 481, 482 are open, the input signal 55 isn't connected to the operational amplifier 41. Therefore, during the first phase 56, the operational amplifier 41 proceeds input/output offset storage, and an offset $V_{os}$ between the first input terminal 411 and the second input terminal 412 of the operational amplifier 41 is saved in the first output capacitor 431 and the second output capacitor 432.

Figure 6B:
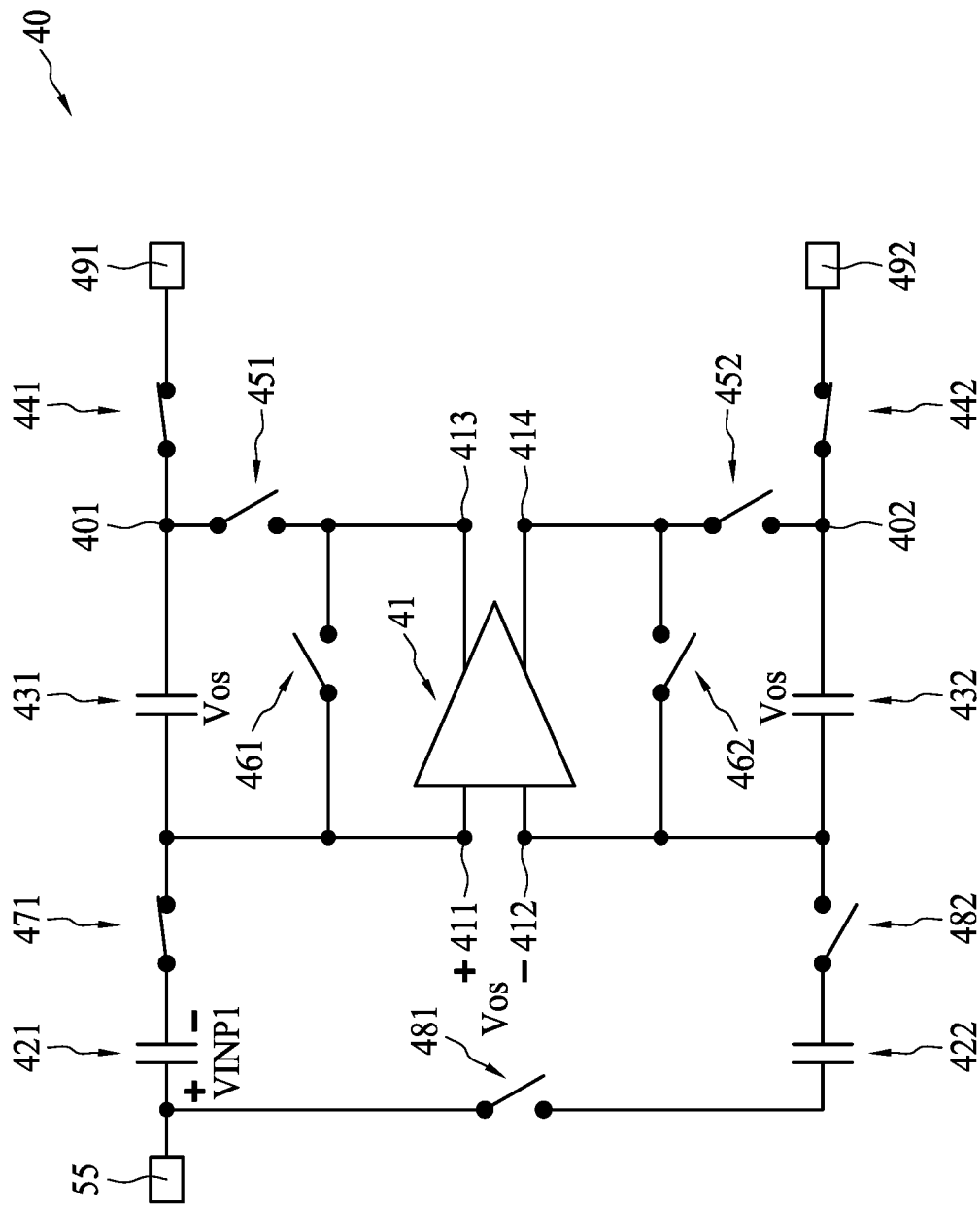
FIG. 6B illustrates a circuit during a second phase of the circuit in FIG. 4 in accordance with some embodiments of the present disclosure.

FIG. 6B illustrates a circuit during a second phase of the circuit in FIG. 4 in accordance with some embodiments of the present disclosure. Referring to FIG. 4, FIG. 5 and FIG. 6B, as stated in the above, during the second phase 57, the sampling cycle 511 of the data clock 51 is at a high level, the half sampling clock 52 is at a low level, the reference sample clock 53 is at a high level, and the data sample clock 54 is at a low level. Thus, during the second phase 57, the sampling switches 441, 442 are closed, the half sampling switches 461, 462 are open, the holding switches 451, 452 are open, the reference sampling switch 471 is closed, and the data sampling switches 481, 482 are open as shown in FIG. 6B. Since the reference sampling switch 471 is closed, the input signal 55 is coupled to the first input capacitor 421 and the operational amplifier 41. Therefore, during the second phase 57, the VINP1 level of the input signal 55 is saved in the first input capacitor 421.

Figure 6C:
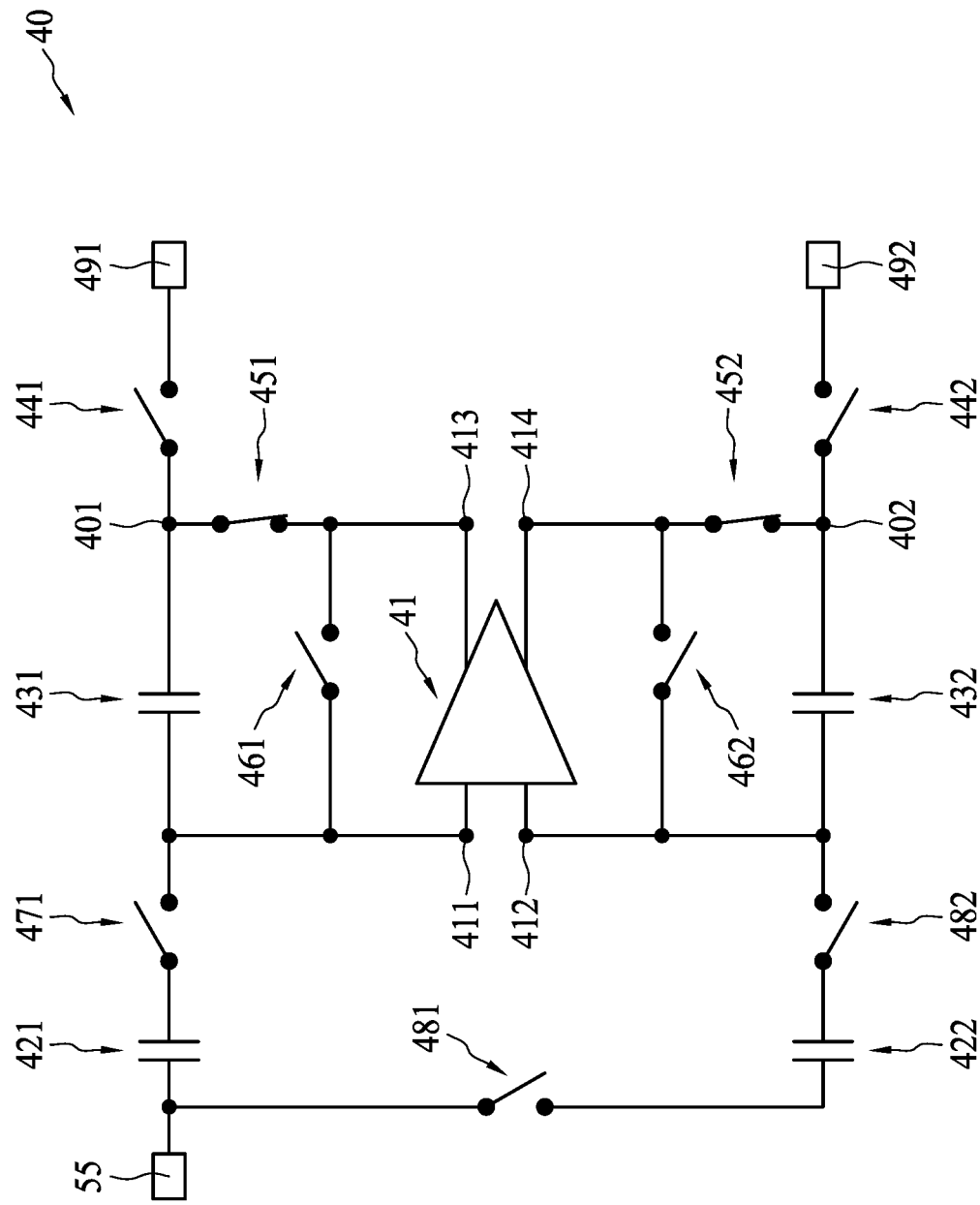
FIG. 6C illustrates a circuit during a third phase of the circuit in FIG. 4 in accordance with some embodiments of the present disclosure.

FIG. 6C illustrates a circuit during a third phase of the circuit in FIG. 4 in accordance with some embodiments of the present disclosure. Referring to FIG. 4, FIG. 4 and FIG. 6C, as stated in the above, during the third phase 58, the holding cycle 512 of the data clock 51 is at a low level, the half sampling clock 52 is at a low level, the reference sample clock 53 is at a low level, and the data sample clock 54 is at a low level. Thus, during the third phase 58, the sampling switches 441, 442 are open, the half sampling switches 461, 462 are open, the holding switches 451, 452 are closed, the reference sampling switch 471 is open, and the data sampling switches 481, 482 are open as shown in FIG. 6C. Since the reference sampling switch 471 and the data sampling switches 481, 482 are open, the first input capacitor 421 holds the VINP1 level of the input signal 55 in the second phase 57. Further, during the third phase 58, the operational amplifier 41 executes offset calibration, and the offset $V_{os}$ stored in the first output capacitor 431 and the second output capacitor 432 in the first phase 56 and the second phase 57 is removed.

Figure 6D:
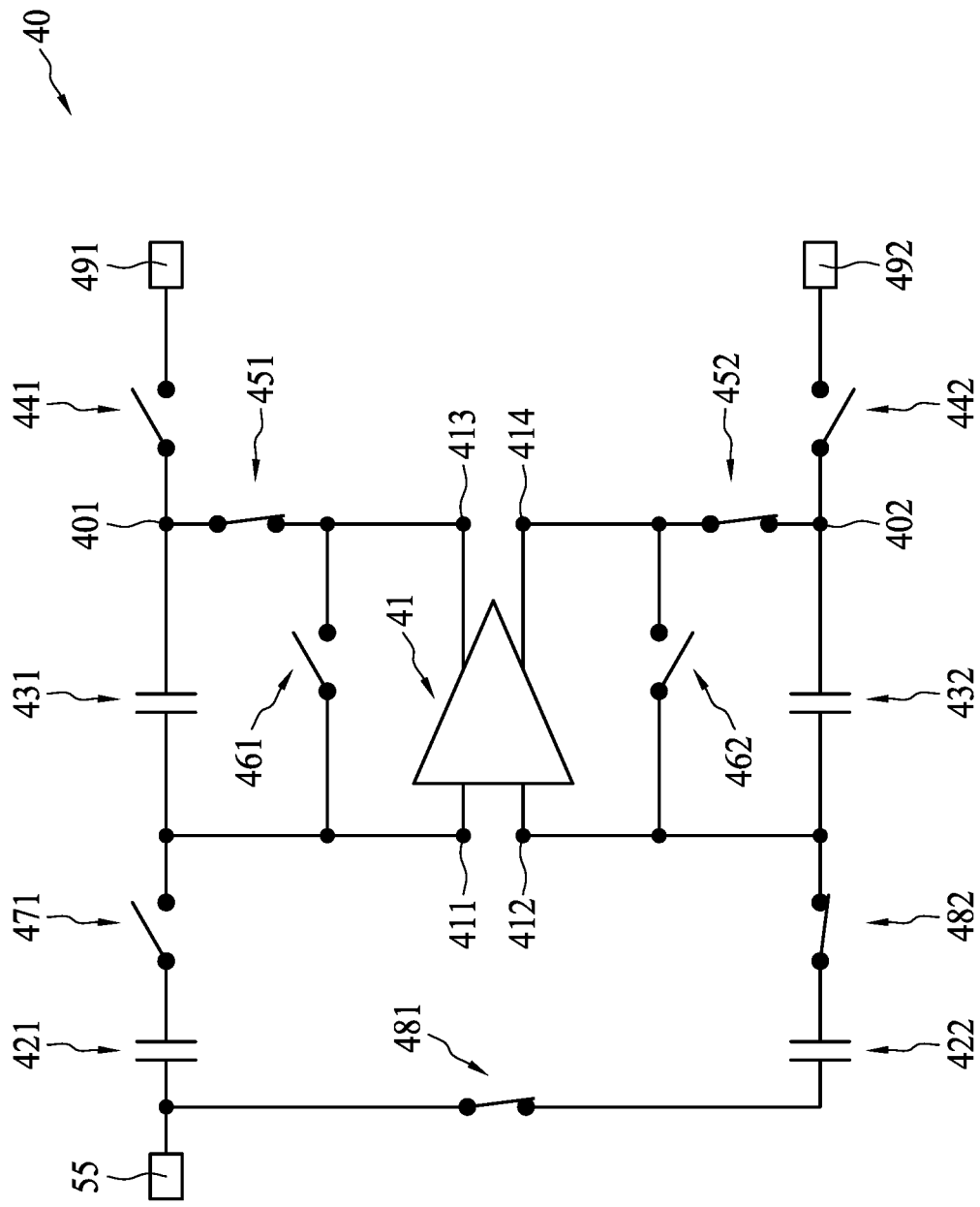
FIG. 6D illustrates a circuit during a fourth phase of the circuit in FIG. 4 in accordance with some embodiments of the present disclosure.

FIG. 6D illustrates a circuit during a fourth phase of the circuit in FIG. 4 in accordance with some embodiments of the present disclosure. Referring to FIG. 4, FIG. 5 and FIG. 6D, as stated in the above, during the fourth phase 59, the holding cycle 522 of the data clock 51 is at a low level, the half sampling clock 52 is at a low level, the reference sample clock 53 is at a low level, and the data sample clock 54 is at a high level. Thus, during the fourth phase 59, the sampling switches 441, 442 are open, the half sampling switches 461, 462 are open, the holding switches 451, 452 are closed, the reference sampling switch 471 is open, and the data sampling switches 481, 482 are closed as shown in FIG. 6D. Since the data sampling switches 481, 482 are closed, the operational amplifier 41 samples the VIND1 level of the input signal 55 and amplifies the data 1 (VINP1-VIND1) on the first output terminal 413 and the second output terminal 414 of the operational amplifier 41. The gain of the operational amplifier 41 is C1/C2.

In accordance with some embodiments of the present disclosure, the circuit 10 may be applied in Built-in-Self-Test automatic device VTGM test system for on die parameter monitoring IP, and may be applied in CCD/CMOS image sensor and scanner analog front end for low noise signal sampling. The circuit 40 may be a correlated double sampler without interleaving. The circuit 40 may perform operational amplifier offset calibration. The circuit 40 may sample signal and amplify signal in one clock cycle. The circuit 40 may be a non-interleaving architecture saving input sampling capacitance which is around 4-8 pF for low noise CCD signal amplification.

Figure 7A:
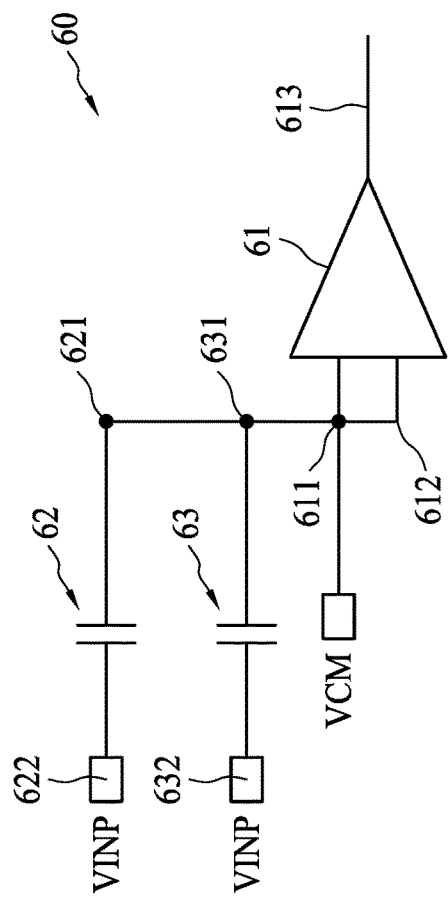
FIG. 7A illustrates a circuit in accordance with some embodiments of the present disclosure.
Figure 7B:
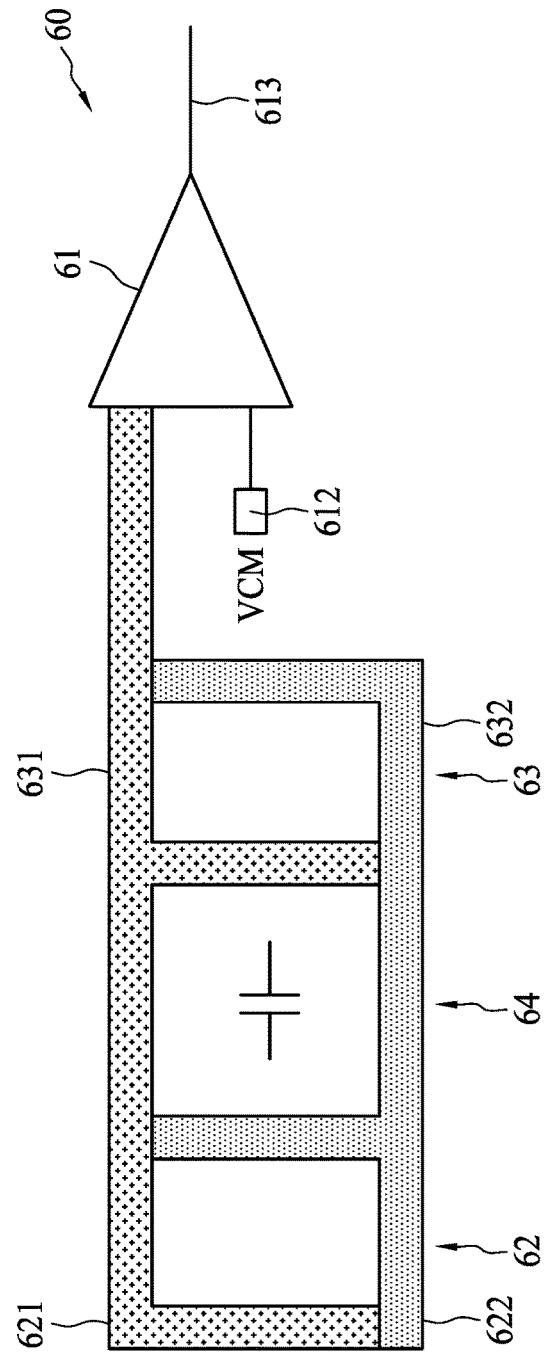
FIG. 7B illustrates a parasitic effect of the circuit in FIG. 7A in accordance with some embodiments of the present disclosure.

FIG. 7A illustrates a circuit in accordance with some embodiments of the present disclosure. FIG. 7B illustrates a parasitic effect of the circuit in FIG. 7A in accordance with some embodiments of the present disclosure. Referring to FIGS. 7A and 7B, a circuit 60 includes an operational amplifier 61, a first capacitor 62 and a second capacitor 63. The operational amplifier 61 having a first input terminal 611, a second input terminal 612, an output terminal 613. The first capacitor 62 includes a first end 621 and a second end 622. The second capacitor 63 includes a third end 631 and a fourth end 632. The first end 621 of the first capacitor 62 is coupled to the third end 631 of the second capacitor 63, and the first end 621 and the third end 631 are coupled to the first input terminal 611 and the second input terminal 612 of the operational amplifier 61. Further, the first input terminal 611 and the second input terminal 612 of the operational amplifier 61 are coupled to a common signal, for example a common voltage VCM. The second end 622 of the first capacitor 62 and the fourth end 632 of the second capacitor 63 are coupled to an input signal, for example an input voltage VINP. The capacitance of the first capacitor 62 is C1, and the capacitance of the second capacitor 63 is C2.

In accordance with some embodiments of the present disclosure, the first end 621 of the first capacitor 62 may be a first top portion of first capacitor 62, and the second end 622 of the first capacitor 62 may be a first bottom portion of the first capacitor 62. The first capacitor 62 may be formed by the first top portion and the first bottom portion. Similarly, the third end 631 of the second capacitor 63 may be a second top portion of second capacitor 63, and the fourth end 632 of the second capacitor 63 may be a second bottom portion of the second capacitor 63. The second capacitor 63 may be formed by the second top portion and the second bottom portion. When the second capacitor 63 is disposed near the first capacitor 62, and at least one end of the first capacitor 62 is coupled to at least one end of second capacitor 63, a parasitic capacitor 64 is formed between the first capacitor 62 and the second capacitor 63. The capacitance of the parasitic capacitor 64 is Cp. The output Q at the output terminal 613 of the operational amplifier 61 may be expressed as:

$$Q=(C1+C2+Cp)\times(VINP-VCM)$$

Figure 8A:
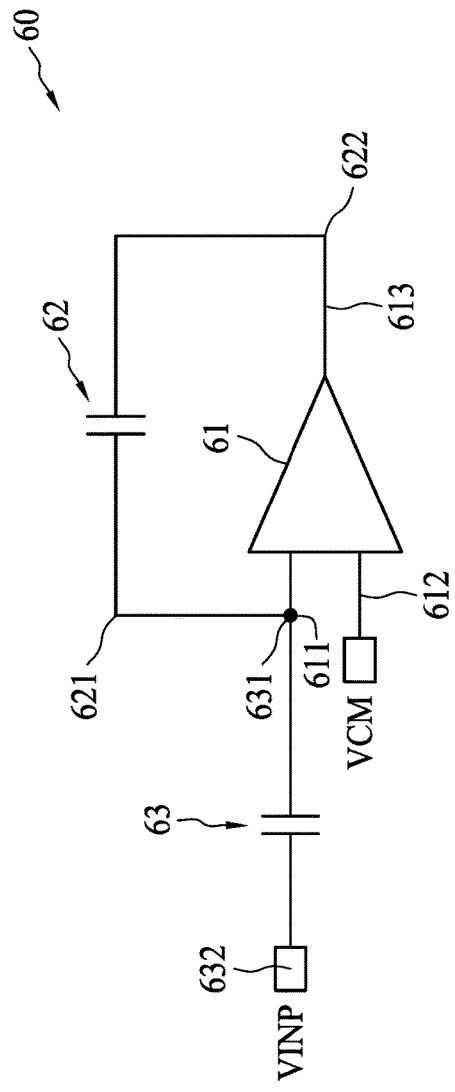
FIG. 8A illustrates a circuit in accordance with some embodiments of the present disclosure.
Figure 8B:
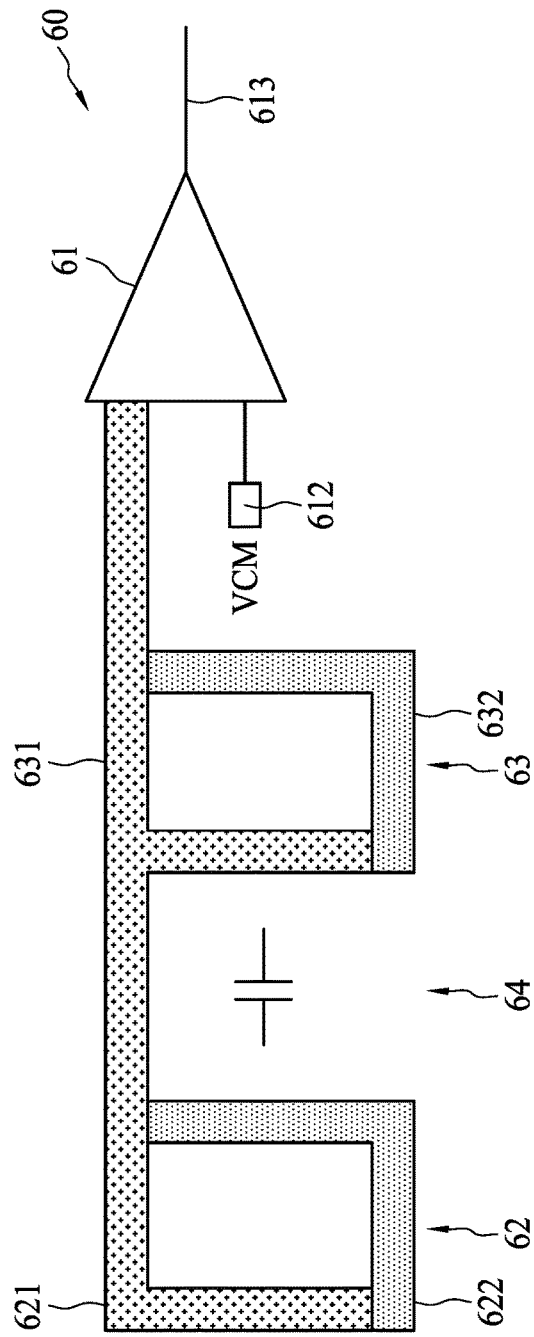
FIG. 8B illustrates a parasitic effect of the circuit in FIG. 8A in accordance with some embodiments of the present disclosure.

FIG. 8A illustrates a circuit in accordance with some embodiments of the present disclosure. FIG. 8B illustrates a parasitic effect of the circuit in FIG. 8A in accordance with some embodiments of the present disclosure. Referring to FIGS. 7A, 7B, 8A and 8B, the first end 621 of the first capacitor 62 is coupled to the third end 631 of the second capacitor 63, and the first end 621 and the third end 631 are coupled to the first input terminal 611 of the operational amplifier 61. Further, the second input terminal 612 of the operational amplifier 61 is coupled to a common signal, for example the common voltage VCM. The second end 622 of the first capacitor 62 is coupled to the output terminal 613 of the operational amplifier 61. The fourth end 632 of the second capacitor 63 is coupled to a common signal, for example the common voltage VCM. When the second capacitor 63 is disposed near the first capacitor 62, and at least one end of the first capacitor 62 is coupled to at least one end of second capacitor 63, a parasitic capacitor 64 is formed between the first capacitor 62 and the second capacitor 63. The capacitance of the parasitic capacitor 64 is Cp. The output Q at the output terminal 613 of the operational amplifier 61 may be expressed as:

$$Q=(C1+Cp)VO\times C2(VCM-VCM)$$

Therefore, a gain of the operational amplifier 61 may be expressed as:

$$VO/VINP=(C1+Cp)/(C1+C2+Cp)$$

There is a gain error introduced by the parasitic capacitance Cp of the parasitic capacitor 64.

Figure 9A:
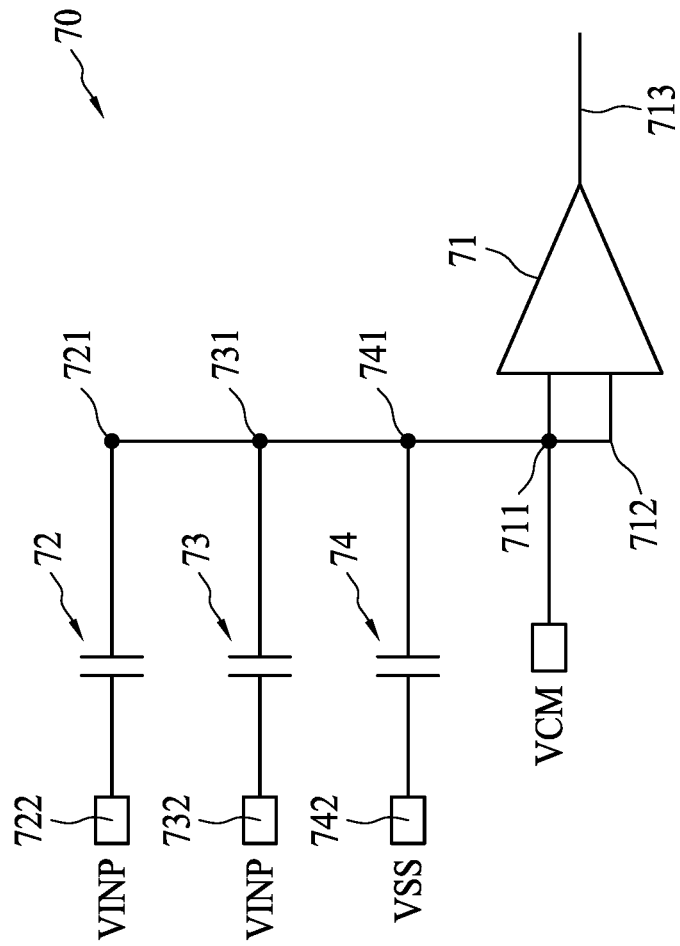
FIG. 9A illustrates a circuit in accordance with some embodiments of the present disclosure.
Figure 9B:
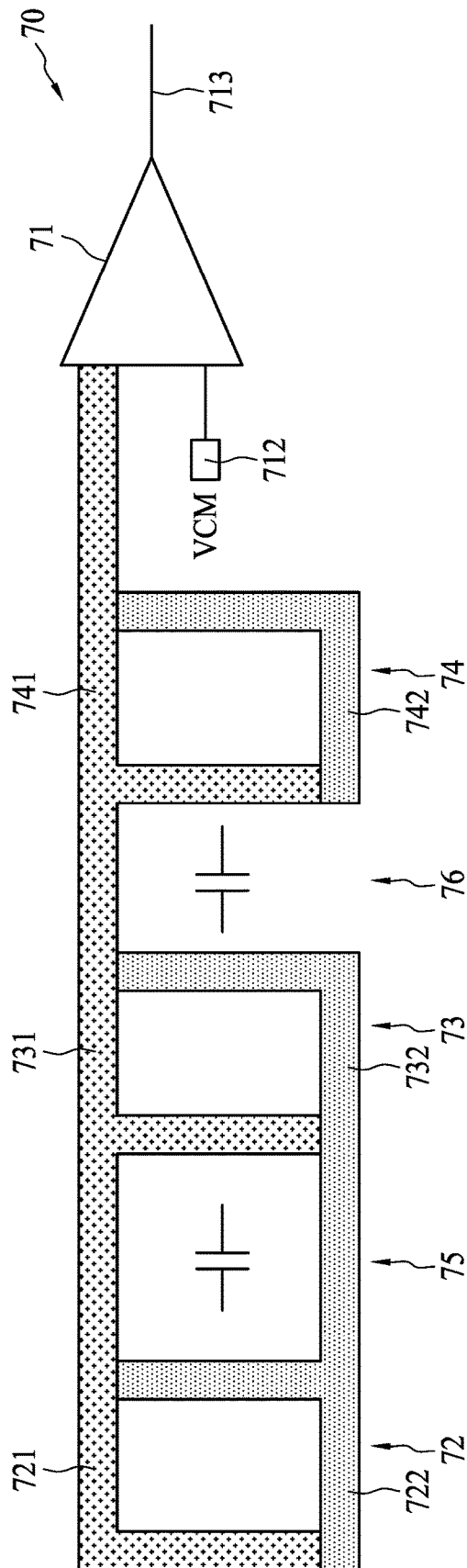
FIG. 9B illustrates a parasitic effect of the circuit in FIG. 9A during a sampling phase in accordance with some embodiments of the present disclosure.

FIG. 9A illustrates a circuit in accordance with some embodiments of the present disclosure. FIG. 9B illustrates a parasitic effect of the circuit in FIG. 9A during a sampling phase in accordance with some embodiments of the present disclosure. Referring to FIGS. 9A and 9B, a circuit 70 includes an operational amplifier 71, a first capacitor 72, a second capacitor 73 and a dummy capacitor 74. The operational amplifier 71 having a first input terminal 711, a second input terminal 712, an output terminal 713. The first capacitor 72 includes a first end 721 and a second end 722. The second capacitor 73 includes a third end 731 and a fourth end 732. The dummy capacitor 74 includes a fifth end 741 and a sixth end 742. The first end 721 of the first capacitor 72 is coupled to the third end 731 of the second capacitor 73 and the fifth end 741 of the dummy capacitor 74, and the first end 621, the third end 631 and the fifth end 741 are coupled to the first input terminal 711 and the second input terminal 712 of the operational amplifier 71. Further, the first input terminal 711 and the second input terminal 712 of the operational amplifier 71 are coupled to a common signal, for example a common voltage VCM. The second end 722 of the first capacitor 72 and the fourth end 732 of the second capacitor 73 are coupled to an input signal, for example an input voltage VINP. The sixth end 742 of the dummy capacitor 74 is coupled to an source, for example an source VSS. The capacitance of the first capacitor 72 is C1, and the capacitance of the second capacitor 73 is C2.

In accordance with some embodiments of the present disclosure, when the second capacitor 73 is disposed near the first capacitor 72, and at least one end of the first capacitor 72 is coupled to at least one end of second capacitor 73, a first parasitic capacitor 75 is formed between the first capacitor 72 and the second capacitor 73. Similarly, when the dummy capacitor 74 is disposed near the second capacitor 73, and at least one end of the dummy capacitor 74 is coupled to at least one end of second capacitor 73, a second parasitic capacitor 76 is formed between the dummy capacitor 74 and the second capacitor 73. The capacitance of the first parasitic capacitor 75 is Cp1. The capacitance of the second parasitic capacitor 76 is Cp2. The output Q at the output terminal 713 of the operational amplifier 71 may be expressed as:

$$Q=(C1+C2+Cp1+Cp2)\times(VINP-VCM)$$

Figure 9C:
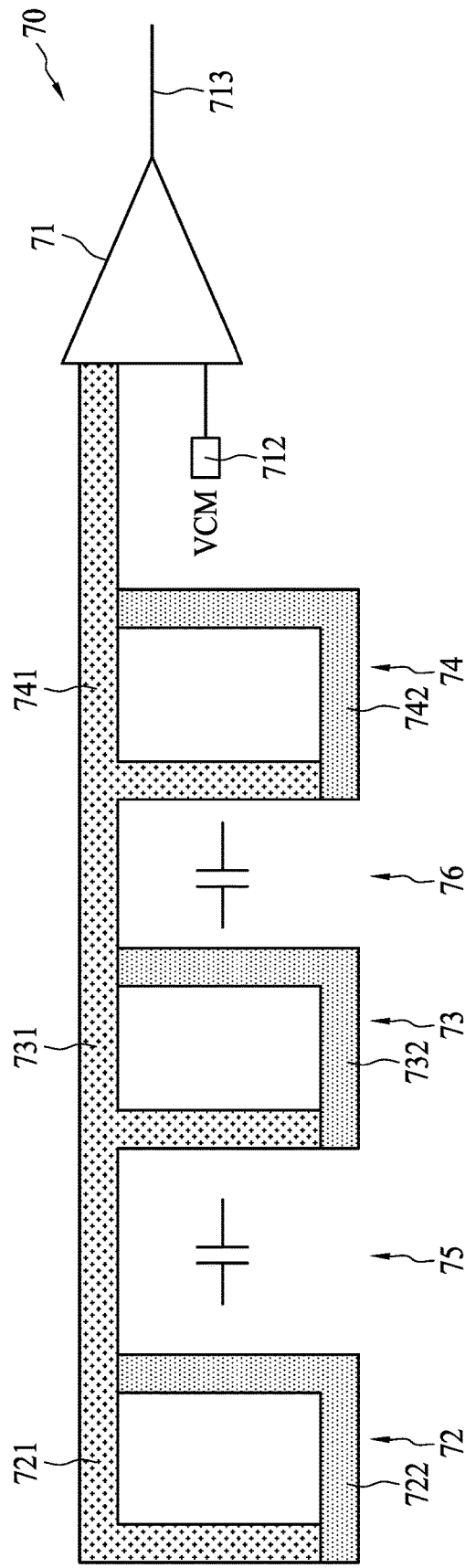
FIG. 9C illustrates a parasitic effect of the circuit in FIG. 9A during a holding phase in accordance with some embodiments of the present disclosure.

FIG. 9C illustrates a parasitic effect of the circuit in FIG. 9A during a holding phase in accordance with some embodiments of the present disclosure. Referring to FIGS. 9A and 9C, the first end 721 of the first capacitor 72 is coupled to the third end 731 of the second capacitor 73 and the fifth end 741 of the dummy capacitor 74, and the first end 621, the third end 631 and the fifth end 741 are coupled to the first input terminal 711 of the operational amplifier 71. Further, the second input terminal 712 of the operational amplifier 71 are coupled to a common signal, for example a common voltage VCM. The second end 722 of the first capacitor 72 is coupled to the output terminal 713 of the operational amplifier 71. The fourth end 732 of the second capacitor 73 is coupled to a common signal, for example the common voltage VCM. When the second capacitor 73 is disposed near the first capacitor 72, and at least one end of the first capacitor 72 is coupled to at least one end of second capacitor 73, a first parasitic capacitor 75 is formed between the first capacitor 72 and the second capacitor 73. Similarly, when the dummy capacitor 74 is disposed near the second capacitor 73, and at least one end of the dummy capacitor 74 is coupled to at least one end of second capacitor 73, a second parasitic capacitor 76 is formed between the dummy capacitor 74 and the second capacitor 73. The capacitance of the first parasitic capacitor 75 is Cp1. The capacitance of the second parasitic capacitor 76 is Cp2. The output Q at the output terminal 613 of the operational amplifier 61 may be expressed as:

$$Q=(C2+Cp2)(VO-VCM) \times (C1+Cp1)(VCM-VCM)$$

Therefore, a gain of the operational amplifier 71 may be expressed as:

$$VO/VINP=(C1+Cp1)/(C1+Cp1+C2+Cp2)$$

In accordance with some embodiments of the present disclosure, the first dummy capacitance Cp1 may be equal to the second dummy capacitance Cp2. Therefore, the gain of the operational amplifier 71 may be the same as the ideal case. By using the dummy capacitor 74, the parasitic effect may be eliminated, and there is no gain error occurred by the parasitic capacitor.

Figure 10:
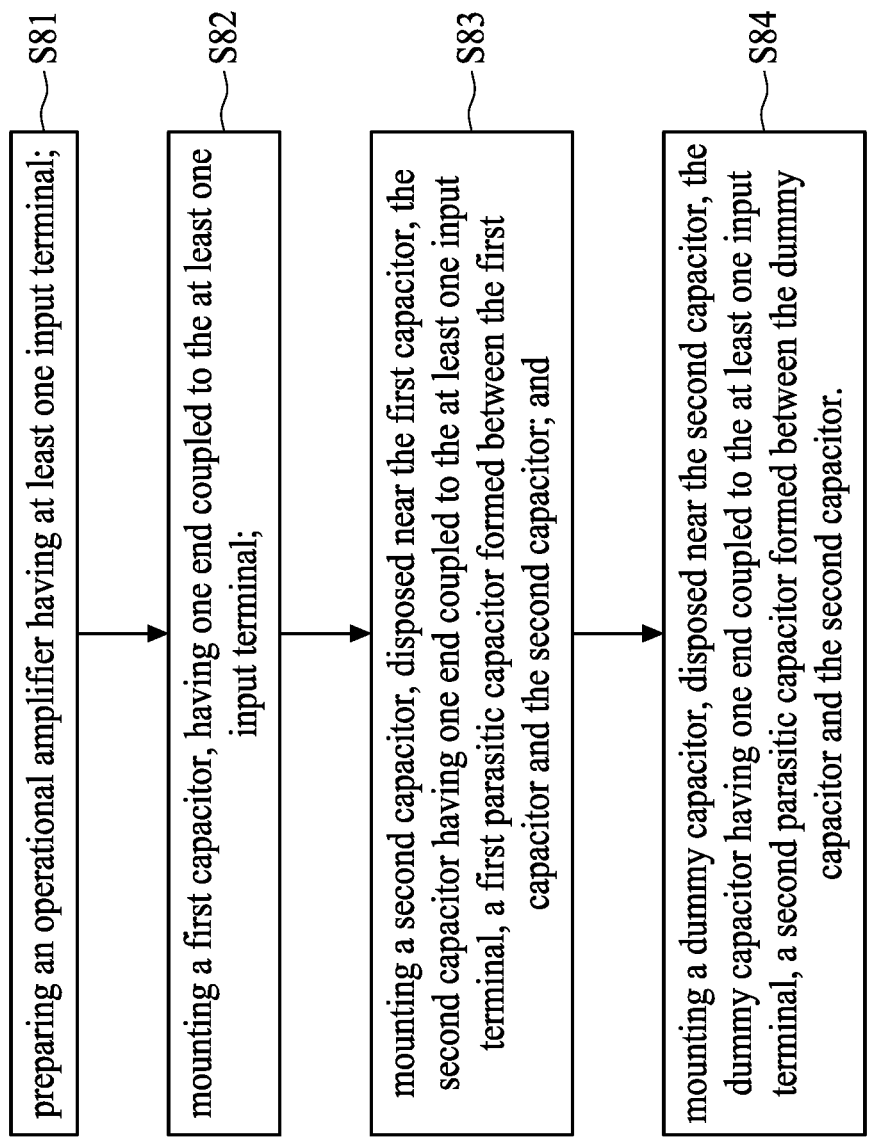
FIG. 10 is a flow diagram showing a method in accordance with some embodiments of the present disclosure.

FIG. 10 is a flow diagram showing a method in accordance with some embodiments of the present disclosure. Referring to FIG. 9A, FIG. 9B, FIG. 9C and FIG. 10, in step S81, an operational amplifier 71 is prepared, the operational amplifier 71 includes at least one input terminal 711. In step S82, a first capacitor 72 is mounted, the first capacitor 72 includes one end 721 coupled to the at least one input terminal 711. In step S83, a second capacitor 73 is mounted and disposed near the first capacitor 72, the second capacitor 73 includes one end 731 coupled to the at least one input terminal 711. A first parasitic capacitor 75 is formed between the first capacitor 72 and the second capacitor 73. In step S84, a dummy capacitor 74 is mounted and disposed near the second capacitor 73, the dummy capacitor includes one end 741 coupled to the at least one input terminal 711. A second parasitic capacitor 76 is formed between the dummy capacitor 74 and the second capacitor 73.

In accordance with some embodiments of the present disclosure, the first capacitor further includes a first top portion and a first bottom portion, the second capacitor further includes a second top portion and a second bottom portion, and the dummy capacitor further includes a third top portion and a third bottom portion. The first parasitic capacitor is formed between first bottom portion of the first capacitor and the second top portion of the second capacitor. The second parasitic capacitor is formed between third top portion of the dummy capacitor and second bottom portion of the second capacitor.

In some embodiments, a circuit is disclosed, including: an operational amplifier, a plurality of input capacitors, a plurality of output capacitors, a plurality of sampling switches, a plurality of holding switches, a plurality of combined switches. The operational amplifier includes a first input terminal, a second input terminal, a first output terminal and a second output terminal. The input capacitors include a first input capacitor and a second input capacitor. One end of the first input capacitor is configured for receiving an input signal, and one end of the second input capacitor is configured for receiving a common signal. The output capacitors include a first output capacitor and a second output capacitor. The first output capacitor is coupled to the first input terminal and a first node, and the second output capacitor is coupled to the second input terminal and a second node. The sampling switches include a first sampling switch, a second sampling switch, a third sampling switch and a fourth sampling switch. The first sampling switch is coupled to the first input terminal and the first output terminal. The second sampling switch is coupled to the second input terminal and the second output terminal. The third sampling switch is coupled to the first node and a first output end. The fourth sampling switch is coupled to the second node and a second output end. The holding switches include a first holding switch and a second holding switch. The first holding switch is coupled to the first node and the first output terminal. The second holding switch is coupled to the second node and the second output terminal. The combined switches include a first combined switch and a second combined switch. The first combined switch is coupled to the other end of the first input capacitor and the first input terminal. The second combined switch is coupled to the other end of the second input capacitor and the second input terminal.

In some embodiments, a circuit is disclosed, including: an operational amplifier, a plurality of input capacitors, a plurality of output capacitors, a plurality of sampling switches, a plurality of holding switches, a plurality of half sampling switches, a reference sampling switch, a plurality of data sampling switches. The operational amplifier includes a first input terminal, a second input terminal, a first output terminal and a second output terminal. The input capacitors include a first input capacitor and a second input capacitor. One end of the first input capacitor is configured for receiving an input signal. The output capacitors include a first output capacitor and a second output capacitor. The first output capacitor is coupled to the first input terminal and a first node. The second output capacitor is coupled to the second input terminal and a second node. The sampling switches include a first sampling switch, a second sampling switch. The first sampling switch is coupled to the first node and a first output end, and the second sampling switch is coupled to the second node and a second output end. The holding switches include a first holding switch and a second holding switch. The first holding switch is coupled to the first node and the first output terminal. The second holding switch is coupled to the second node and the second output terminal. The half sampling switches include a first half sampling switch and a second half sampling switch. The first half sampling switch is coupled to the first input terminal and the first output terminal. The second half sampling switch is coupled to the second input terminal and the second output terminal. The reference sampling switch is coupled to the other end of the first input capacitor and the first input terminal. The data sampling switches include a first data sampling switch and a second data sampling switch. The first data sampling switch is coupled to the one end of the first input capacitor and one end of the second input capacitor. The second data sampling switch is coupled to the other end of the second input capacitor and the second input terminal.

In some embodiments, a method is disclosed, including: preparing an operational amplifier having at least one input terminal; mounting a first capacitor, having one end coupled to the at least one input terminal; mounting a second capacitor, disposed near the first capacitor, the second capacitor having one end coupled to the at least one input terminal, a first parasitic capacitance formed between the first capacitor and the second capacitor; and mounting a dummy capacitor, disposed near the second capacitor, the dummy capacitor having one end coupled to the at least one input terminal, a second parasitic capacitance formed between the dummy capacitor and the second capacitor.

What is claimed is:

1. A circuit, comprising:
an operational amplifier, having a first input terminal, a second input terminal, a first output terminal and a second output terminal;
a plurality of input capacitors, having a first input capacitor and a second input capacitor, one end of the first input capacitor configured for receiving an input signal, one end of the second input capacitor configured for receiving a common voltage signal;
a plurality of output capacitors, having a first output capacitor and a second output capacitor, the first output capacitor coupled to the first input terminal and a first node, the second output capacitor coupled to the second input terminal and a second node;
a plurality of sampling switches, having a first sampling switch, a second sampling switch, a third sampling switch and a fourth sampling switch, the first sampling switch directly coupled to the first input terminal and the first output terminal, the second sampling switch directly coupled to the second input terminal and the second output terminal, the third sampling switch directly coupled to the first node and a first output end, and the fourth sampling switch directly coupled to the second node and a second output end;
a plurality of holding switches, having a first holding switch and a second holding switch, the first holding switch coupled to the first node and the first output terminal, the second holding switch coupled to the second node and the second output terminal; and
a plurality of combined switches, having a first combined switch and a second combined switch, the first combined switch coupled to the other end of the first input capacitor and the first input terminal, the second combined switch coupled to the other end of the second input capacitor and the second input terminal.

2. The circuit of claim 1, wherein the sampling switches are controlled by a sampling cycle of a data clock.

3. The circuit of claim 2, wherein the holding switches are controlled by a holding cycle of the data clock.

4. The circuit of claim 3, wherein the combined switches are controlled by a combined clock combined from a reference sample clock and a data sample clock.

5. The circuit of claim 4, wherein during a first phase, the sampling switches are closed, the holding switches are open, and the combined switches are open.

6. The circuit of claim 5, wherein during a second phase, the sampling switches are closed, the holding switches are open, and the combined switches are closed.

7. The circuit of claim 6, wherein during a third phase, the sampling switches are open, the holding switches are closed, and the combined switches are open.

8. The circuit of claim 7, wherein during fourth phase, the sampling switches are open, the holding switches are closed, and the combined switches are closed.

9. The circuit of claim 8, wherein an offset voltage is saved in the first output capacitor and the second output capacitor during the first phase.

10. The circuit of claim 9, wherein a first voltage of the input signal is saved in the first input capacitor during the second phase.

11. The circuit of claim 10, wherein the offset voltage is removed during the third phase.

12. The circuit of claim 11, wherein, during the fourth phase, the operational amplifier is configured to sample a second voltage of the input signal and amplify a difference voltage between the first voltage and the second voltage.

13. A circuit, comprising:
an operational amplifier, having a first input terminal, a second input terminal, a first output terminal and a second output terminal;
a plurality of input capacitors, having a first input capacitor and a second input capacitor;
a plurality of output capacitors, having a first output capacitor and a second output capacitor;
a plurality of sampling switches, having a first sampling switch, a second sampling switch, a third sampling switch and a fourth sampling switch;
a plurality of holding switches, having a first holding switch and a second holding switch; and
a plurality of combined switches, having a first combined switch and a second combined switch,
wherein the first sampling switch comprises two ends directly coupled to the first input terminal and the first holding switch, respectively, the second sampling switch comprises two ends directly coupled to the second input terminal and the second holding switch, respectively, the third sampling switch comprises two ends directly coupled to the first output capacitor and a first output end, respectively, and the fourth sampling switch comprises two ends directly coupled to second output capacitor and a second output end,
wherein the first combined switch comprises two ends coupled to the first input capacitor and the first input terminal, respectively, and the second combined switch comprises two ends coupled to the second input capacitor and the second input terminal, respectively,
wherein the first sampling switch is further coupled and the first output terminal, and the second sampling switch is further coupled to the second output terminal.

14. The circuit of claim 13, wherein the third sampling switch is further coupled to the first holding switch.

15. The circuit of claim 13, wherein the fourth sampling switch is further coupled to the second holding switch.

16. The circuit of claim 13, wherein the first output capacitor is further coupled to the first combined switch.

17. The circuit of claim 13, wherein the second output capacitor is further coupled to the second combined switch.

18. A circuit, comprising:
an operational amplifier, having a first input terminal, a second input terminal, a first output terminal and a second output terminal;
a plurality of input capacitors, having a first input capacitor and a second input capacitor;
a plurality of output capacitors, having a first output capacitor and a second output capacitor;
a plurality of sampling switches, having a first sampling switch, a second sampling switch, a third sampling switch and a fourth sampling switch;
a plurality of holding switches, having a first holding switch and a second holding switch; and
a plurality of combined switches, having a first combined switch and a second combined switch,
wherein the first combined switch comprises two ends coupled to the first input capacitor and the first output capacitor, respectively, and the second combined switch comprises two ends coupled to the second input capacitor and the second output capacitor, respectively, wherein the first sampling switch comprises two ends directly coupled to the first input terminal and the first output terminal, respectively, the second sampling switch comprises two ends directly coupled to the second input terminal and the second output terminal, respectively, the third sampling switch comprises two ends directly coupled to the first output capacitor and a first output end, respectively, and the fourth sampling switch comprises two ends directly coupled to second output capacitor and a second output end, wherein the first holding switch comprises two ends coupled to the first sampling switch and the third sampling switch, respectively, and the second holding switch comprises two ends coupled to the second sampling switch and the fourth sampling switch, respectively.

19. The circuit of claim 18, wherein the first holding switch is further coupled to the first output terminal.

20. The circuit of claim 18, wherein the second holding switch is further coupled to the second output terminal.

* * * * *